United States Patent [19]

Yiu

[11] Patent Number: 4,931,904
[45] Date of Patent: Jun. 5, 1990

[54] LOCALIZED CIRCUIT CARD COOLING DEVICE
[75] Inventor: Joseph T. Yiu, Chandler, Ariz.
[73] Assignee: Motorola, Inc., Schaumburg, Ill.
[21] Appl. No.: 357,846
[22] Filed: May 30, 1989
[51] Int. Cl.⁵ ............................................. H05K 7/20
[52] U.S. Cl. .................................................... 361/384
[58] Field of Search ............... 361/384, 383, 382, 399, 361/412

[56] References Cited
U.S. PATENT DOCUMENTS
4,291,364 9/1981 Andros ................................. 361/384
4,399,485 8/1983 Wright et al. ....................... 361/384
4,498,118 2/1985 Bell ..................................... 361/384

FOREIGN PATENT DOCUMENTS
20458 2/1982 Japan ................................... 361/384

Primary Examiner—Roy N. Envall, Jr.
Attorney, Agent, or Firm—Walter W. Nielsen

[57] ABSTRACT

A localized circuit card cooling device is mounted adjacent to a target circuit card in an unused circuit card mounting location of an electronic system enclosure to provide localized cooling to the target circuit card or a predetermined portion thereof.

5 Claims, 3 Drawing Sheets

U.S. Patent  Jun. 5, 1990  Sheet 1 of 3  4,931,904
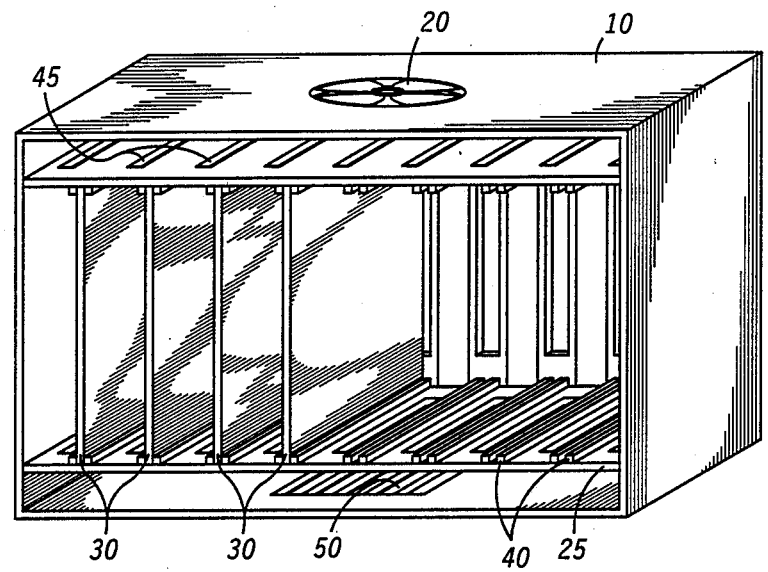
FIG. 1
—PRIOR ART—
FIG. 2
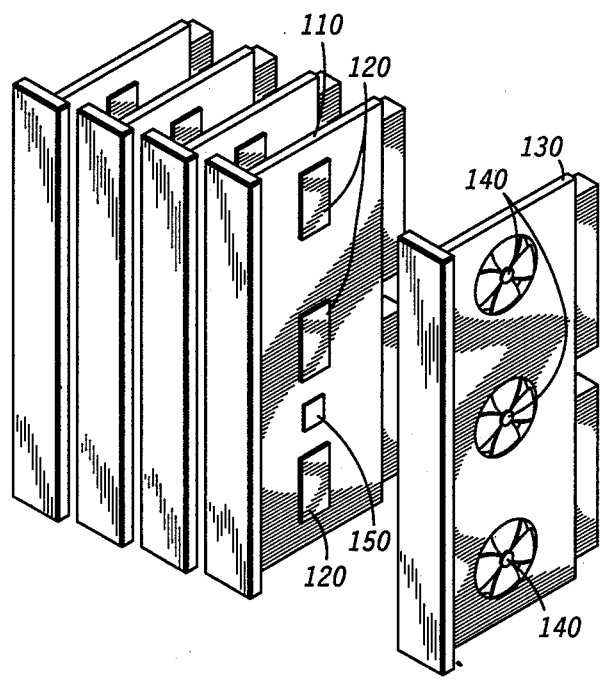

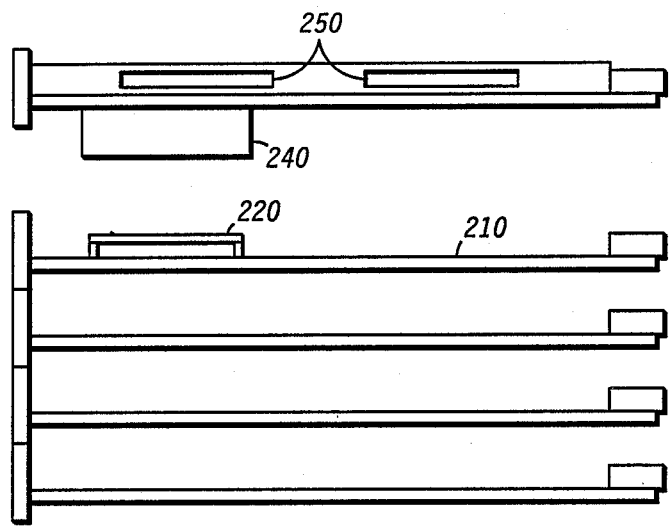
FIG. 3
FIG. 4
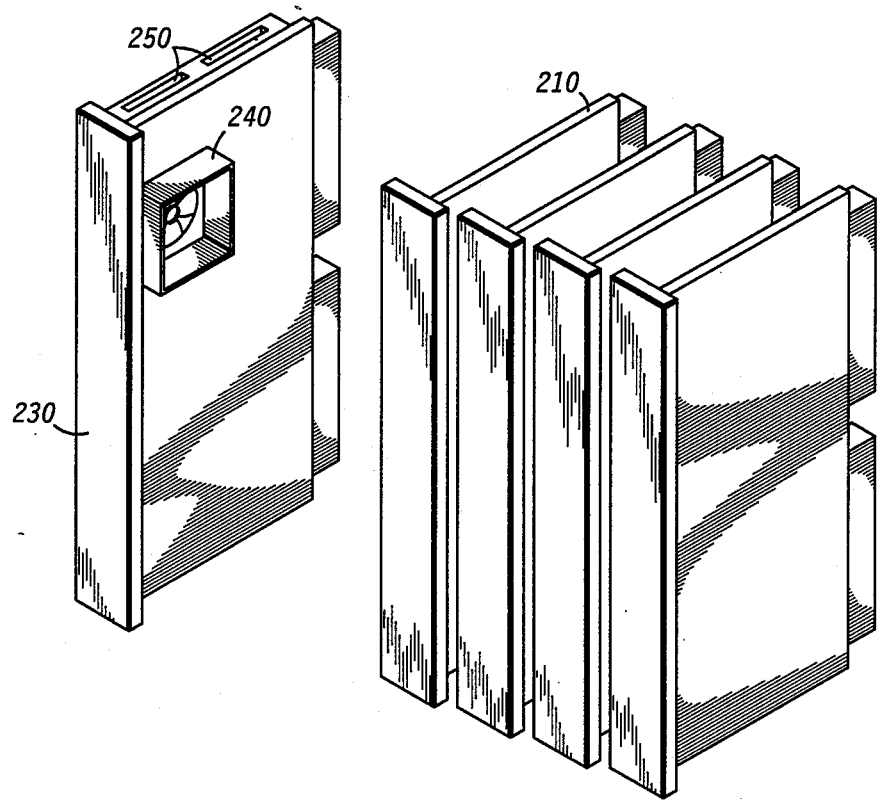

LOCALIZED CIRCUIT CARD COOLING DEVICE

BACKGROUND OF THE INVENTION

This invention relates, in general, to cooling devices for electronic systems and, more particularly, to a localized circuit card cooling device for providing localized cooling to a particular portion of a particular card of a multicard rack mounted electronic system.

There are currently available cooling devices for multicard rack mounted electronic systems which provide generalized cooling for the circuit cards contained therein. However, in most of these systems the cooling provided is not concentrated on a particular card or a particular portion of a particular card. The most common cooling system consists of a rack mounted fan which simply provides for the movement of ambient air throughout the entire electronic system cabinet with no particular control over what amount of cooling is provided to any individual card or portion thereof. This allows particular circuit cards or particular portions of particular circuit cards to operate at a higher temperature than the surrounding devices and in some cases results in degraded performance or damage to the devices in question. In some cases in order to provide the required cooling for a particular card the cooling capacity of the overall system is increased thereby increasing the cost and decreasing the efficiency of the cooling system.

SUMMARY OF THE INVENTION

It is therefore an object of the present invention to provide a localized circuit card cooling device which provides very localized cooling to a particular circuit card or a particular portion of a particular circuit card in a multicard rack mounted electronic system.

Another object of the present invention is to provide a localized circuit card cooling device which may be added to an existing multicard rack mounted electronic system without modification to the existing circuit cards or the rack mounts provided therefor.

Yet another object of the present invention is to provide a localized circuit card cooling device which can be easily modified to provide for changes in the cooling requirements of a particular target circuit card as a result of modifications to the target circuit card or a particular portion thereof.

The above and other features and objects are provided in the present invention wherein there is provided a circuit card cooling device for providing localized cooling to a target portion of a target circuit card. The circuit card cooling device comprises a circuit card having at least one fan mounted thereon such that when the circuit card cooling device is mounted adjacent to the target circuit card in an electronic system rack, the fan is adjacent to the target portion of the target circuit card. The circuit cooling card may further comprise ducting adjacent to and substantially surrounding the target area of the target circuit card.

BRIEF DESCRIPTION OF THE DRAWINGS

The above mentioned and other features of the invention and the manner of attaining them will become most apparent and the invention itself would be best understood by reference to the following description of an embodiment of the invention taken in conjunction with the accompanying drawings wherein:

FIG. 1 is a drawing of a typical prior art electronic system cooling device;

FIG. 2 is a drawing illustrating the preferred embodiment of the present invention;

FIG. 3 is a top view diagram of an alternative embodiment of the present invention; and FIG. 4 is an additional view of the alternative embodiment of the present invention shown in FIG. 3.

DETAILED DESCRIPTION OF THE DRAWINGS

Figure 5:
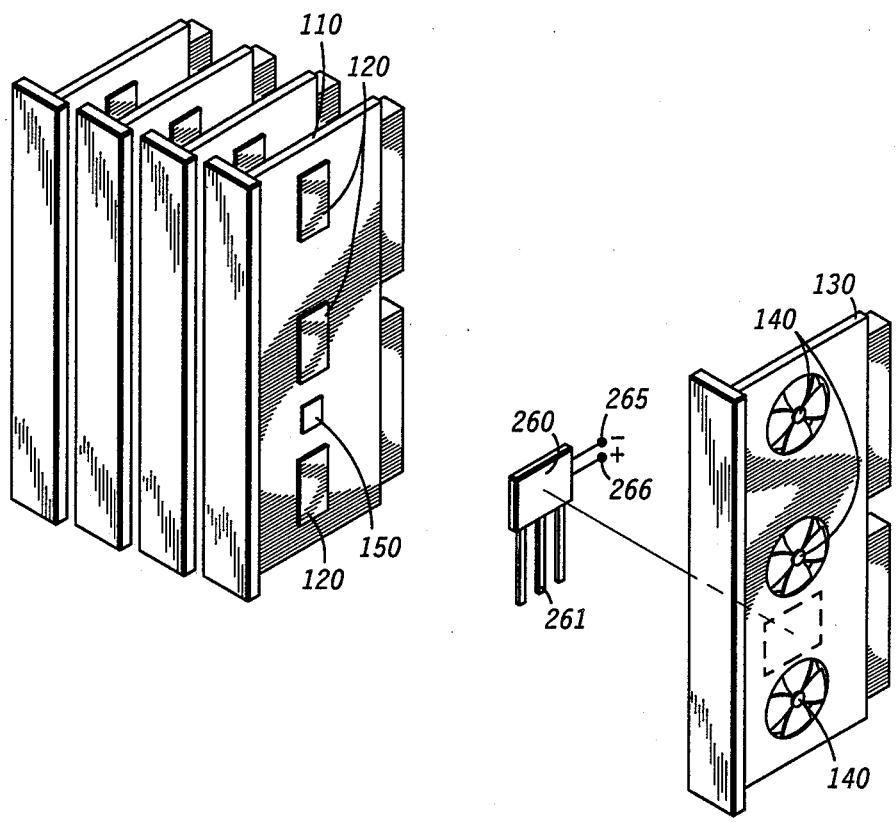
FIG. 5 is a perspective view of another alternative embodiment of the present invention.

FIG. 1 illustrates a typical prior art electronic system cooling device wherein a cabinet mounted fan 20 is mounted in electronic system rack 10. Cross braces 25 have both guides to provide for the slidable mounting of individual circuit cards 30 and openings 45 to allow ambient air to pass from outside the cabinet, through fan 20, through said openings 45 and to exit the chassis through vent 50. There would frequently be unused circuit card locations 40 as a result of either using an off-the-shelf chassis with excess capacity or specifically designing in excess capacity for future expansion. As a result this system would provide for very inefficient cooling.

For example, the air flow in general would seek to follow the path through the empty card slots rather than those occupied simply because they provide less resistance to the flow of air. This would result in a larger portion of the intended cooling air passing through the unoccupied slots thereby allowing increased heating of circuit cards 30. In addition there is no method of providing any localized cooling in such a system to either a particular circuit card 30 or a particular portion of a particular circuit card 30.

FIG. 2 illustrates a preferred embodiment of the present invention wherein cooling fans 140 are mounted on circuit card 130 such that when circuit card 130 is mounted in the rack adjacent to target circuit card 110 having target cooling areas 120 the cooling fans 140 pull ambient air from within the system cabinet and direct same at target areas of circuit card 110. As an additional feature a temperature sensor 150 may be mounted on target circuit card 110 and wired through the existing connectors to circuit card 130. A thermostatic control mechanism for fans 140 mounted on circuit card 130 would then provide thermostatic temperature control for the target area of circuit card 110.

As can be seen the number and location of the cooling fans mounted on adjacent circuit card 130 may be tailored to provide the required cooling for particular target areas of circuit card 110. The system provides not only very localized cooling but increases the overall efficiency of the cooling system by directing cooling air directly at the required components thereby reducing the overall cooling capacity required for the entire electronic system.

FIG. 3 is a top view of an alternative embodiment of the present invention wherein circuit card 230 has a cooling fan mounted therein adjacent to the target cooling area 220 of target circuit card 210. In this case however, a tailored duct 240 is provided which substantially surrounds target area 220. In addition, the fan may be operated in the reverse direction thereby providing a partial vacuum through duct 240 and drawing ambient air in from the surrounding area past target cooling area 220 through duct 240 and out through exhaust ducts 250 in circuit card 230. An additional view of this alternative embodiment is provided in FIG. 4 which illustrates the relative location of the circuit card cooling device 230, duct 240 and exhaust ports 250.

In yet another embodiment of the present invention one or more bimetallic electronic cooling devices are combined with cooling fans 140 shown in FIG. 2 such that the air directed by fans 140 to target areas 120 is not ambient air within the electronic system but actively cooled air which is passed through appropriate portions of a bimetallic cooling unit. For example, a thermoelectric cooler module such as part number MI-1069 available from Marlow Industries, Inc. 10451 Vista Park Road, Dallas, Tex., 75238 may be employed.

This is shown in FIG. 5, wherein bimetallic cooling element 260 is mounted on circuit card 130 such that its cooling members 261 are disposed in the output air stream of the lowermost fan 140 shown in FIG. 5, thus cooling the air stream before it impacts target circuit card 110. Bimetallic cooling element 260 comprises power supply leads 265 and 266. Additional bimetallic cooling elements 260 may optionally be used on circuit card 130, for example, in conjunction with the uppermost and center fans 140.

The cooling capacity provided by the inventive system is easily modified by simply providing a different configuration circuit card adjacent to the target circuit card in a given electronic system. This results in a very flexible, very efficient method of providing localized cooling to particular portions of particular circuit cards in a given multicard rack mounted electronic system. This particular system has been illustrated with, for example a VME computer system rack but could be easily be adapted to any electronic system wherein circuit cards are mounted in a parallel fashion in an electronic system cabinet.

What has been provided therefore as a localized circuit card cooling device which provides localized cooling to a target portion of particular circuit card. In addition thermostatic controlled temperature sensing may be used as well as ducted fan enclosures and bimetallic electronic cooling elements.

While there have been described above the principles of the invention and specific configurations in conjunction with specific devices and systems, it is to be clearly understood that this description is made only by way of example and not as a limitation of the scope of the invention.

What is claimed is:

1. A circuit card cooling device for cooling at least one target circuit card having a predetermined target cooling area and mounted in an electronic system enclosure wherein said electronic system enclosure has at least one unused circuit card mounting location adjacent to said at least one target circuit card, said circuit card cooling device comprising:

fan support means for mounting in said at least one unused circuit card mounting location;

one or more fans mounted on said fan support means, wherein said one or more fans are operated to direct ambient air from within said electronic system enclosure onto said at least one target circuit card; and electronic cooling means mounted on said fan support means such that ambient air is drawn past and cooled by said electronic cooling means before being directed onto said at least one target circuit card.

2. A circuit card cooling device in accordance with claim 1 wherein at least one of said one or more fans is mounted on said fan support means directly adjacent to said predetermined target cooling area of said at least one target circuit card.

3. A circuit card cooling device in accordance with claim 1 further comprising:

temperature sensing means mounted on said at least one target circuit card; and thermostatic control means mounted on said fan support means, coupled to said temperature sensing means and coupled to at least one of said one or more fans.

4. A circuit card cooling device in accordance with claim 1 further comprising:

duct means, mounted on said fan support means, having an inlet duct formed to substantially surround said predetermined target cooling area of said target circuit card and having one or more exhaust ducts wherein said one or more fans are housed within said duct means and are operated to draw ambient air from within said electronic system enclosure past said target cooling area and out said one or more exhaust ducts.

5. A circuit card cooling device in accordance with claim 1, wherein said electronic cooling means comprises a bimetallic cooling unit.

* * * * *